March 3, 1964 J. L. HUTSON ET AL 3,123,750

MULTIPLE JUNCTION SEMICONDUCTOR DEVICE

Filed Oct. 31, 1961

INVENTORS
JEARLD L. HUTSON,
FREDERICK B. HOFF, JR.
BY

McMorrow, Berman + Davidson
ATTORNEYS.

United States Patent Office 3,123,750
Patented Mar. 3, 1964

3,123,750

MULTIPLE JUNCTION SEMICONDUCTOR DEVICE

Jearld L. Hutson and Frederick B. Hoff, Jr., both of Richardson, Tex., assignors to Hunt Electronics Company, Dallas, Tex., a corporation of Texas Filed Oct. 31, 1961, Ser. No. 148,924
12 Claims. (Cl. 317—235)

This invention relates to multiple junction semiconductor devices, and more particularly to semiconductor devices having at least three junctions and two stable modes of operation, namely, the "off" state and the "on" state and being especially suitable for use in switching circuits.

A main object of the invention is to provide a novel and improved semiconductor device of the symmetrical type especially suitable for use with applications using alternating current.

A further object of the invention is to provide an improved semiconductor device of the symmetrical type having accurately controlled sensitivity, and which is stable at elevated temperature.

A still further object of the invention is to provide an improved semiconductor device of the symmetrical type which has relatively high sensitivity to the rate of rise of the voltage applied thereto.

A still further object of the invention is to provide an improved semiconductor device of the symmetrical type which can be made to reliably switch on with both the positive and the negative halves of an alternating current signal applied thereto.

A still further object of the invention is to provide an improved semiconductor device of the symmetrical type which is so constructed that it can be turned on below the breakdown voltage of its internal reverse biased junction by applying thereto a signal voltage having a time rate of increase sufficient to cause current to flow so that the alpha of the device exceeds unity.

Further objects and advantages of the invention will become apparent from the following description and claims, and from the accompanying drawings, wherein:

Figure 1:
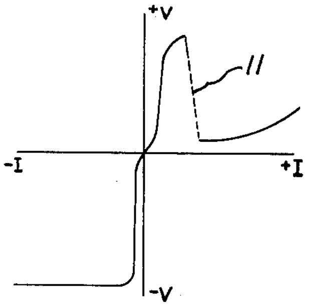
FIGURE 1 is a curve showing the voltage-current characteristic of a typical PNPN semiconductor device.

A semiconductor PNPN device is a unit having three junctions and two stable modes of operation, one being the "off" state and the other being the "on" state, and having the voltage current characteristic illustrated in FIGURE 1. Thus, in FIGURE 1, the avalanche or breakdown condition is illustrated by the dotted line 11, the "off" state being the portion of the characteristic to the left of the breakdown portion 11 and the "on" state being represented by the portion of the characteristic to the right of the breakdown portion 11.

Figure 2:
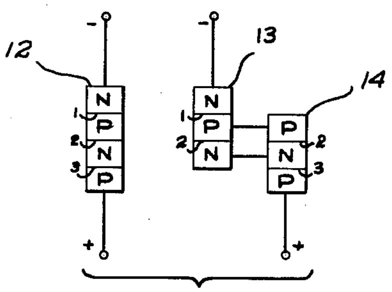
FIGURE 2 is a diagrammatic illustration of a NPNP semiconductor device and its two-transistor analogue.

FIGURE 2 illustrates the PNPN unit, shown at 12, and its two-transistor analogue, represented by the transistors 13 and 14 connected in the manner illustrated. The device 12 switches from the "off" to the "on" state when its alpha, or current gain, exceeds unity. The well known method of firing or switching the device is to increase the voltage applied thereacross until the junction 2 thereof breaks down or avalanches. In the avalanche condition the current increases rapidly, therefore increasing the alpha until it exceeds unity, and the device then turns on. The dotted line 11 in the characteristic of FIGURE 1 illustrates this event.

Another method of turning the device on is to apply thereto a signal voltage which is relatively steep, namely, which has a "rate of rise" greater than a predetermined value, said rate of rise being sufficiently great to increase the alpha to greater than unity. At equilibrium a PN junction has a space charge region which opposes the drift of current carriers and acts as a built-in capacitor. The charge on this capacitor is related to the applied voltage as follows:

$$Q=CV$$

As the voltage is increased, the time rate of change of charge, or current density, also increases, assuming the capacitance to remain constant, as follows:

$$J=C\frac{dV}{dt}$$

wherein, as in the above previously stated equation, C represents the junction capacitance, V represents the applied voltage, and J represents the current density (time rate of change of the charge Q). It will be seen that for fast rising voltages the value of J can be substantial. It can be further seen that if the "rate of rise" of the applied voltage is sufficient, the current in the device will be great enough so that the alpha of the device exceeds unity, and it will therefore switch to the "on" state at a voltage value which may be substantially below the avalanche voltage of the junction 2.

In actuality, in a diffused junction the capacitance is approximately inversely proportional to the cube root of the applied voltage due to the widening of the space charge region under reverse bias. Therefore, sufficient current density can still be attained by the "rate of rise" method for the alpha of the device to exceed unity.

Figure 3:
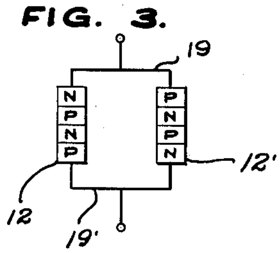
FIGURE 3 is a diagrammatic illustration showing two three-junction semiconductor devices connected in parallel with opposite polarity.
Figure 4:
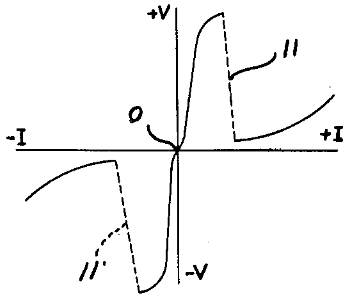
FIGURE 4 is a curve showing the voltage-current characteristic of the parallel-connected devices of FIGURE 3.

In many applications using alternating currents it is required that two PNPN devices be used in parallel with opposite polarity in the manner illustrated in FIGURE 3. Thus, as shown in FIGURE 3, two oppositely poled three-junction semiconductor devices 12 and 12' are connected in parallel. This provides the composite voltage-current characteristic illustrated in FIGURE 4, wherein the dotted line portions 11 and 11' represent the availanche or breakdown regions for applied voltages going on opposite sides of the zero point. If the devices 12 and 12' are closely matched, the characteristic curve will be substantially symmetrical on opposite sides of the zero point, the device being "on" for the portion of the characteristic to the right of the dotted line 11 for one-half of the applied alternating current voltage cycle and being likewise "on" at the left of the dotted line 11' during the corresponding portion of the other half cycle of the applied voltage.

Figure 5:
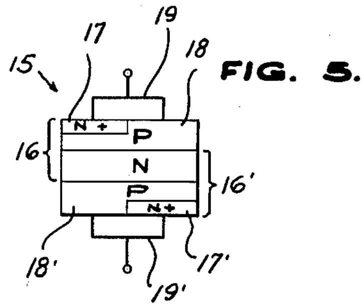
FIGURE 5 is a diagrammatic illustration of a composite structure electrically similar to that of FIGURE 3 mounted on the same semiconducting wafer, of the type known as a "shorted base" configuration.

By selected diffusion the two three-junction devices may be unified so that they can be mounted on the same semiconductor wafer in the manner illustrated in FIGURE 5. The composite device 15 of FIGURE 5 is known as a "shorted base" configuration due to the high conductivity of the PN layers at its surfaces 16 and 16'. The composite devices such as 15 illustrated in FIGURE 5 are relatively insensitive to rate of rise of applied voltage and are relatively stable at elevated temperatures, and are thus particularly suitable for applications requiring these characteristics.

It will be seen that the device 15 is electrically similar to the device represented by the parallel-connected oppositely poled semiconductor units 12 and 12′ of FIGURE 3, and that the device 15 may be considered as having NPN transistors at each of the surfaces 16 and 16′. It will be further seen that the emitter 17 and the base 18 at the surface 16 are connected by the terminal conductor 19, and similarly, the emitter 17′ and the base 18′ of the NPN transistor at the surface 16′ are connected by the terminal conductor 19′.

The alpha of the NPN transistors at the surfaces 16 and 16′ is a function of the emission efficiency of the emitter junction. It is known to those familiar with this art that very little injection of carriers is accomplished at a PN junction until the forward bias at the junction is sufficient to overcome the equilibrium space charge field. This is approximately .2 volt for germanium and .5 volt for silicon. When this space charge is overcome, the emission efficiency, and therefore the alpha, of the NPN transistor increases rapidly.

Figure 6:
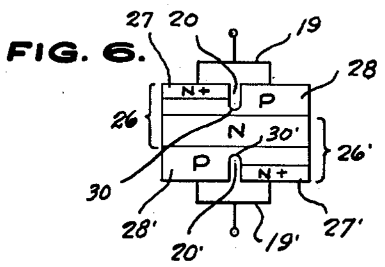
FIGURE 6 is a diagrammatic illustration showing an improved configuration of a symmetrical semiconductor device constructed in accordance with the present invention and which has greatly increased sensitivity to the rate of rise of the applied signal than that of FIGURE 5.

A more desirable configuration of a device of the type represented by the device 15 would be one in which the short circuits between the emitters and bases of the components NPN transistors were eliminated or minimized, so that much more of applied voltage is across each emitter junction. FIGURE 6 illustrates an improved configuration, in accordance with the present invention, which is much more "rate of rise" sensitive than the shorted base configuration shown in FIGURE 5. In the configuration of FIGURE 6 channels 20 and 20′ are formed respectively between the emitter 27 and base 28 and the emitter 27′ and base 28′, said channels being of substantial depth and being of sufficient depth to greatly increase the resistance across the path between the connections of the conductors 19 and 19′ to the emitters and bases. The increased resistance of the path can be attributed to the greatly reduced cross sectional area of the bases 28 and 28′ adjacent the bottom ends 30 and 30′ of the channels 20 and 20′. With channels of the order of depth illustrated in FIGURE 6, the resistance becomes several magnitudes higher than with the configuration illustrated in FIGURE 5, the configuration of FIGURE 6 having a much higher alpha than that of FIGURE 5 and being much more sensitive to the rate of rise of any applied voltage wave form.

As will be readily apparent, the device of FIGURE 6 is symmetrical and therefore can be made to switch "on" with both the positive and negative halves of an alternating current signal, responsive either to voltage magnitude exceeding the avalanche value or the provision of sufficient rate of rise of voltage in the wave form to trigger the device.

Figure 7:
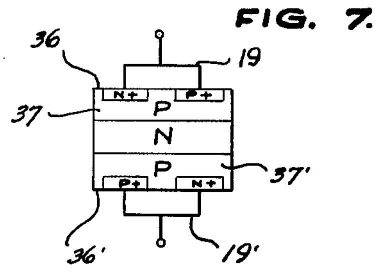
FIGURE 7 is a diagrammatic illustration of another form of improved configuration of the present invention wherein the N+ and the P+ emitters on each surface are isolated by a relatively high resistivity path.

FIGURE 7 illustrates another embodiment of a symmetrical multiple junction semiconductor device with greatly increased sensitivity to the rate of voltage rise, constructed in accordance with the present invention. In the form of the invention shown in FIGURE 7, the N+ and P+ emitters on each of the surfaces 36 and 36′ are separated by substantial distances in their adjacent base layers 37 and 37′, being thus isolated by relatively high resistivity paths, assuming the conductivity of the P+ and N+ layers to be much higher than that of the P bases 37 and 37′. Since ordinarily, the conductivity of the materials employed for the N+ and P+ emitters will be much higher than that of the material employed for the P bases 37 and 37′, the composite structure illustrated in FIGURE 7 will have substantially the same characteristics as the structure of FIGURE 6 which employs the channels 20 and 20′. Either of the forms of the invention of FIGURES 6 or 7 employs the same general concept, namely, that of increasing the internal resistivity path in the unit between the elements connected by the paralleling conductors 19 and 19′.

Figure 8:
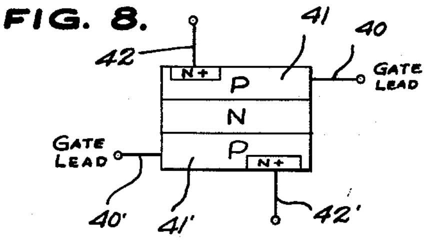
FIGURE 8 is a diagrammatic illustration showing a typical symmetrical semiconductor device of the type which is provided with gate leads for firing same.

FIGURE 8 diagrammatically illustrates a well known method of firing a symmetrical device of the same general nature as the device 15 of FIGURE 5. In the configuration illustrated in FIGURE 8 gate leads 40 and 40′ are connected to the P bases 41 and 41′, the emission efficiency being increased by forward biasing the emitter junctions by the application of suitable biasing voltage by means of the gate leads 40, 40′ and emitter leads 42, 42′. However, as will be readily understood, the necessity of attaching gate leads, such as the leads 40 and 40′, greatly complicates the manufacturing procedure and accordingly considerably increases the cost of fabrication of the unit.

It can be seen that for a configuration such as that shown in the device of FIGURE 5, in order to switch the device to the "on" state, sufficient voltage must be applied to break down the internal reverse bias junction. In the device illustrated in FIGURE 8, the device is turned "on" by the aid of the forward biasing action rendered possible by the use of the additional gate leads 40 and 40′. However, in the improved devices according to the present invention illustrated in FIGURES 6 and 7, the devices can be turned "on" by the provision of sufficient "rate of rise" in the applied signal voltage, because of the isolation of the P and N emitters on the surfaces of the devices.

It will therefore be apparent that the provision of the high-resistivity internal paths between the regions containing the connections of the terminal conductors 19 and 19′ in FIGURES 6 and 7 provides an action which may be considered substantially equivalent to the provision of the gate leads 40 and 40′ in the arrangement illustrated in FIGURE 8.

While certain specific embodiments of an improved symmetrical switch device have been disclosed in the foregoing description, it will be understood that various modifications within the spirit of the invention may occur to those skilled in the art. Therefore, it is intended that no limitations be placed on the invention except as defined by the scope of the appended claims.

What is claimed is:

1. A symmetrical switching device comprising a semiconductor body having a plurality of alternating regions of opposite conductivity separated by rectifying barrier zones, said regions being arranged in a composite configuration equivalent to a pair of oppositely poled diodes, respective terminal conductors connecting adjacent oppositely conductive regions of the body to effectively connect said diodes in parallel, whereby to provide symmetrical switching action for both halves of an alternating current voltage wave applied to the device, and means providing relatively high internal resistivity in the body between the connections of said terminal conductors thereto, whereby the device is relatively sensitive to the rate of change of the voltage applied thereto.

2. A symmetrical switching device comprising a semiconductor body having a plurality of alternating regions of opposite conductivity separated by rectifying barrier zones, said regions being arranged in a composite configuration having adjacent regions of opposite conductivity at remotely spaced portions of the body and being equivalent to a pair of oppositely poled diodes, and respective terminal conductors connecting said adjacent regions, whereby to connect said oppositely poled diodes in parallel, the connections of the terminal conductors including an internal relatively high resistivity path through said adjacent regions, whereby to render the device relatively sensitive to the rate of change of the voltage applied to the terminal conductors.

3. A symmetrical switching device comprising a semiconductor body having a plurality of alternating regions of opposite conductivity separated by rectifying barrier zones, said regions being arranged in a composite configuration having adjacent regions of opposite conductivity at remotely spaced portions of the body and being equivalent to a pair of oppositely poled diodes, respective terminal conductors connecting said adjacent regions at said remotely spaced portions, whereby to connect said oppositely poled diodes in parallel, and means defining a relatively high internal resistivity path between said adjacent regions, whereby to render the device relatively sensitive to the rate of change of the voltage applied to the terminal conductors.

4. A symmetrical switch device comprising a semiconductor body having a plurality of alternating regions of opposite conductivity separated by rectifying barrier zones, said regions being arranged in a composite configuration having adjacent regions of opposite conductivity at remotely spaced portions of the body and being equivalent to a pair of oppositely poled diodes, respective terminal conductors connecting said adjacent regions at said remotely spaced portions, whereby to connect said oppositely poled diodes in parallel, the regions containing the connections of the terminal conductors being spaced apart sufficiently to define a relatively high resistivity internal path therebetween, whereby to render the device relatively sensitive to the rate of change of the voltage applied to the terminal conductors.

5. A symmetrical switching device comprising a semiconductor body having a plurality of alternating regions of opposite conductivity separated by rectifying barrier zones, said regions being arranged in a composite configuration having adjacent regions of opposite conductivity at remotely spaced portions of the body and being equivalent to a pair of opposite poled diodes, respective terminal conductors connecting said adjacent regions at said remotely spaced portions, whereby to connect said oppositely poled diodes in paralllel, the opposite ends of the body being formed with channels between the connections of the terminal conductors of sufficient depth to provide relatively high internal resistivity between the regions containing said connections, whereby to render the device relatively sensitive to the rate of change of the voltage applied to the terminal conductors.

6. A symmetrical switching device comprising a semiconductor wafer having a plurality of alternating regions of opposite conductive material thereon separated by rectifying barrier zones, the wafer having at least two adjacent regions of opposite conductivity at each end and the regions being arranged to define a pair of oppositely poled four-layer diodes terminating at the ends of the wafer, respective terminal conductors connecting two adjacent regions at the ends of the wafer, whereby to connect the diodes in parallel, and means between the connections of the terminal conductors defining high resistivity paths in the material, whereby to render the device relatively sensitive to a rapid change in voltage applied to the terminal conductors.

7. A symmetrical switching device comprising a semiconductor wafer having a plurality of alternating regions of oppositely conductive material thereon separated by rectifying barrier zones, the wafer having at least two adjacent regions of opposite conductivity at each end and the regions being arranged to define a pair of oppositely poled four-layer diodes terminating at the ends of the wafer, and respective terminal conductors connecting the two adjacent regions at the ends of the wafer, whereby to connect the diodes in parallel, the connections of the terminal conductors including an internal relatively high resistivity path through said adjacent regions, whereby to render the device relatively sensitive to a rapid change in voltage applied to the terminal conductors.

8. A symmetrical switching device comprising a semiconductor wafer having a plurality of alternating regions of oppositely conductive material thereon separated by rectifying barrier zones, the wafer having at least two adjacent regions of opposite conductivity at each end and the regions being arranged to define a pair of oppositely poled four-layer diodes terminating at the ends of the wafer, and respective terminal conductors connecting the two adjacent regions at the ends of the wafer, whereby to connect the diodes in parallel, the regions containing the connections of the terminal conductors being spaced apart sufficiently to define a relatively high resistivity internal path therebetween, whereby to render the device relatively sensitive to a rapid change in voltage applied to the terminal conductors.

9. A symmetrical switching device comprising a semiconductor wafer having a plurality of alternating regions of oppositely conductive material thereon separated by rectifying barrier zones, the wafer having at least two adjacent regions of opposite conductivity at each end and the regions being arranged to define a pair of oppositely poled four-layer diodes terminating at the ends of the wafer, and respective terminal conductors connecting the two adjacent regions at the ends of the wafer, whereby to connect the diodes in parallel, the opposite ends of the body being formed with channels between the connections of the terminal connectors of sufficient depth to provide relatively high internal resistivity between the regions containing said connections, whereby to render the device relatively sensitive to a rapid change in voltage applied to the terminal conductors.

10. A symmetrical switching device comprising a semiconductor wafer having at least three alternating regions of oppositely conductive material thereon separated by rectifying barrier zones, whereby the wafer has end regions of the same conductivity, each end region being provided with at least one relatively limited region of opposite conductivity with a rectifying barrier zone between the limited regions and end regions, respective terminal conductors connecting the limited regions to the adjacent end regions, whereby to define a pair of oppositely poled diodes connected in parallel, and means between the two end connections of the terminal conductors defining high resistivity internal paths in the material of the end regions, whereby to render the device relatively sensitive to a rapid change in voltage applied to the terminal conductors.

11. A symmetrical switching device comprising a semiconductor wafer having at least three alternating regions of oppositely conductive material thereon separated by rectifying barrier zones, whereby the wafer has end regions of the same conductivity, each end region being provided with at least one relatively limited region of opposite conductivity with a rectifying barrier zone between the limited regions and end regions, and respective terminal conductors connecting the limited regions to the adjacent end regions, whereby to define a pair of oppositely poled diodes connected in parallel, the end regions being formed with channels adjacent said limited regions and between the two end connections of the associated terminal conductors, said channels extending for the major portion of the depth of the end regions, defining high resistivity internal paths in the material of the end regions, whereby to render the device relatively sensitive to a rapid change in voltage applied to the terminal conductors.

12. A symmetrical switching device comprising a semiconductor wafer having at least three alternating regions of oppositely conductive material thereon separated by rectifying barrier zones, whereby the wafer has end regions of the same conductivity, each end region being provided with two spaced limited additional regions of opposite conductivity, and respective terminal conductors connecting the limited regions of the respective end regions together, whereby to define a pair of oppositely poled diodes connected in parallel, the limited additional regions being spaced apart by substantial distances, whereby to define high resistivity internal paths in the material of the end regions therebetween, and whereby to render the device relatively sensitive to a rapid change in voltage applied to the terminal conductors.

No references cited.

Notice of Adverse Decision in Interference

In Interference No. 95,681 involving Patent No. 3,123,750, J. L. Hutson and F. B. Hoff, Jr., MULTIPLE JUNCTION SEMICONDUCTOR DEVICE, final judgment adverse to the patentees was rendered Aug. 23, 1968, as to claims 1, 2, 3, 6 and 7.

[*Official Gazette October 29, 1968.*]